(12) United States Patent
Sage

(10) Patent No.: US 8,644,054 B2
(45) Date of Patent: Feb. 4, 2014

(54) CIRCUIT

(75) Inventor: Raymond Sage, Everett, WA (US)

(73) Assignee: Raymond L. Sage, Everett, WA (US)

( * ) Notice: Subject to any disclaimer, the term of this patent is extended or adjusted under 35 U.S.C. 154(b) by 0 days.

(21) Appl. No.: 13/403,164

(22) Filed: Feb. 23, 2012

(65) Prior Publication Data

US 2012/0218811 A1  Aug. 30, 2012

Related U.S. Application Data

(60) Provisional application No. 61/447,596, filed on Feb. 28, 2011.

(51) Int. Cl.
*G11C 8/00* (2006.01)

(52) U.S. Cl.
USPC ............................................ 365/149; 365/156

(58) Field of Classification Search
USPC .................................................. 365/149, 156
See application file for complete search history.

(56) References Cited

U.S. PATENT DOCUMENTS

| 2005/0287736 | A1* | 12/2005 | Porter et al. | .................. 438/238 |
| 2010/0309710 | A1* | 12/2010 | Evans, Jr. | ...................... 365/145 |
| 2011/0299327 | A1* | 12/2011 | Asa | ............................... 365/156 |

* cited by examiner

*Primary Examiner* — Michael Tran
(74) *Attorney, Agent, or Firm* — Lane Powell, PC; Priya Sinha Cloutier

(57) ABSTRACT

An object of the current invention is to provide DRAM that is not limited by capacitors.

9 Claims, 3 Drawing Sheets

CIRCUIT

CROSS-REFERENCES TO RELATED APPLICATIONS

This application claims priority to U.S. Provisional Patent Application No. 61/447,596, filed on Feb. 28, 2011. The current application incorporates U.S. Provisional Patent Application No. 61/447,596, in its entirety, by reference.

STATEMENT REGARDING FEDERALLY SPONSORED RESEARCH OR DEVELOPMENT

Not Applicable

INCORPORATION-BY-REFERENCE OF MATERIAL SUBMITTED ON A COMPACT DISC

Not Applicable

TECHNICAL FIELD

This invention relates generally to the formation of integrated circuit devices and more particularly to a memory storage device known as Random Access Memory ("RAM"), also known as Read/Write Memory ("RWM").

BACKGROUND OF INVENTION

Modern types of writable RAM generally store data in either the state of a flip flop, as in static RAM ("SRAM"), or as a charge in a capacitor (or transistor gate), as in dynamic RAM ("DRAM"). DRAM stores each bit of data in a separate capacitor within an integrated circuit. A basic DRAM cell is shown in FIG. 1; it comprises of one transistor and one capacitor.

DRAM was invented in 1966 by Dr. Robert Dennard and he was awarded US Patent in 1968 (U.S. Pat. No. 3,387,286). Since this time, the basic DRAM device has consisted of a single transistor and increasingly complex capacitors.

There are several problems associated with the capacitor design. First, because capacitors leak, the data stored in a capacitor will be lost unless the capacitor is refreshed periodically. Second, scaling a capacitor creates larger current leakage. The limiting factor in the basic capacitor/transistor building block is the capacitor.

Cell capacitance is the key parameter used to determine sensing signal margin, sensing speed, data retention time and endurance against soft error. It is generally accepted that the minimum cell capacitance should be 25 fF/cell regardless of minimum feature size, density, and chip size. The requirement of memory cell capacitance over 25 fF/cell is a practical design guideline rather than a theoretical limit. This requirement imposes a great challenge on giga-bit scaled DRAMs because capacitor area is scaled down with the square of the minimum feature size. Capacitors can be fabricated as high stacks or deep trenches. However, if the overall memory size shrinks because of increased density or a smaller process node, then the capacitor will have to be made higher or deeper in order to maintain the minimum charge required for reliable operation. We are fast approaching scaling limits for the capacitor.

BRIEF DESCRIPTION OF INVENTION

An object of the current invention is to provide DRAM that is not limited by capacitors.

BRIEF DESCRIPTION OF THE SEVERAL VIEWS OF THE DRAWINGS

Other features and advantages of the present invention will become apparent in the following detailed descriptions of the preferred embodiment with reference to the accompanying drawings, of which.

DETAILED DESCRIPTION OF THE INVENTION

In the description of the invention above and in the detailed description of the invention and claims below, and in the accompanying drawings, reference is made to particular features (including method steps) of the invention. It is to be understood that the disclosure of the invention in this specification includes all possible combinations of such particular features. For example, where a particular feature is disclosed in the context of a particular aspect or embodiment of the invention, or a particular claim, that feature can also be used, to the extent possible, in combination with and/or in the context of other particular aspects and embodiments of the invention, and in the invention generally.

Figure 1:
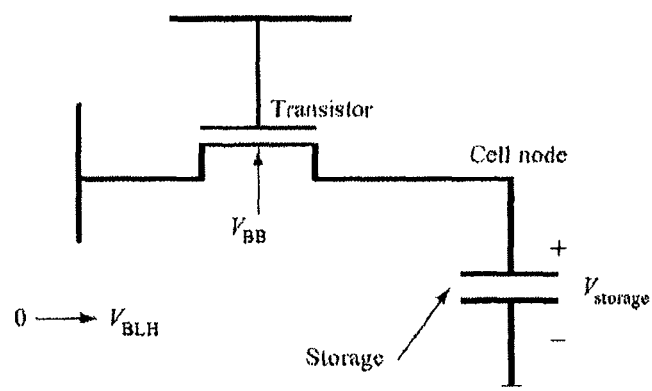
FIG. 1 is a prior art circuit.
Figure 2:
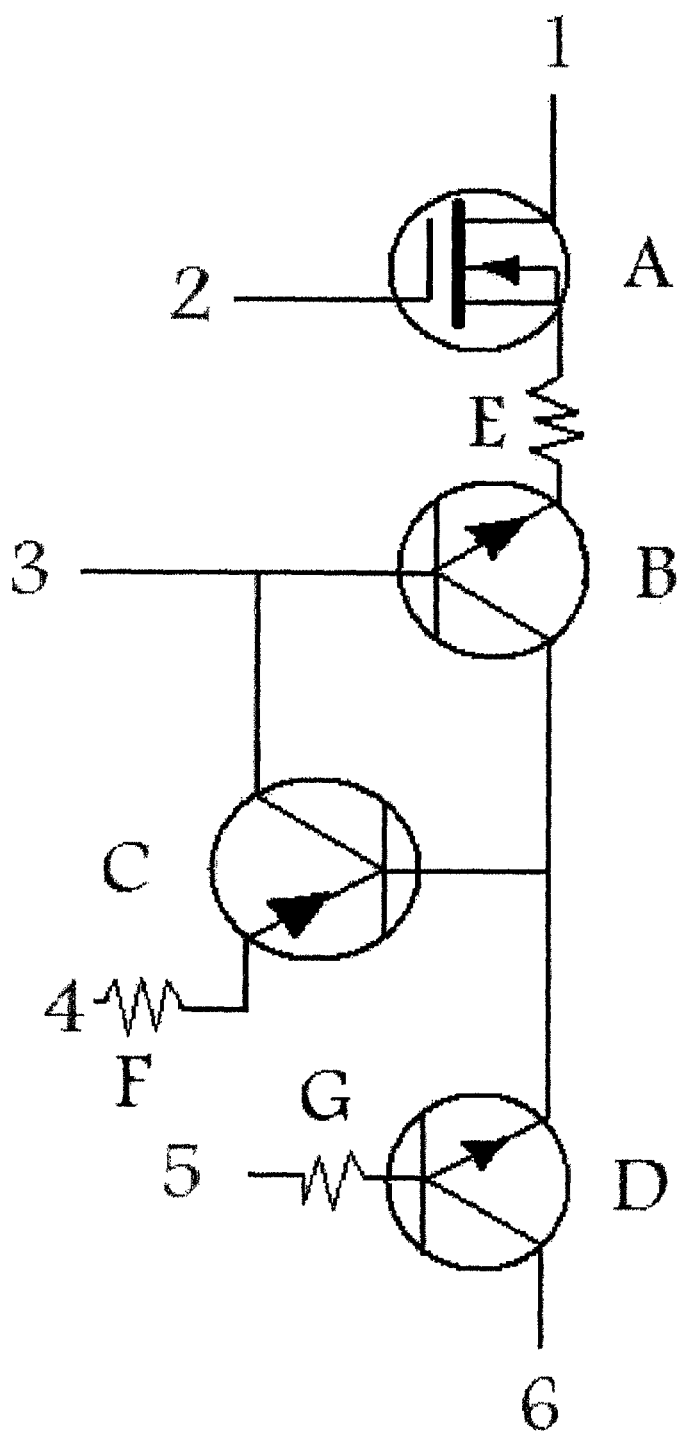
FIG. 2 is an embodiment of the circuit described herein.

In a first embodiment, the invention relates to a circuit for a transistor DRAM and is shown, generally, in FIG. 2.

The components of the circuit are listed below:

| Component | Component Type |
|---|---|
| A | NPN Depletion Mode Transistor |
| B | NPN Transistor |
| C | PNP Transistor |
| D | NPN Transistor |
| E | Pull-down Resistor |
| F | Pull-down Resistor |
| G | Pull-down Resistor |

Component A was chosen to be a NPN Depletion Mode Transistor because this type of transistor allows a fairly low current to pass through at a steady rate. Components B and D were chosen to be NPN Transistors because they will allow current to flow through without changing the signal. Component C was chosen to be a PNP transistor because it will accept a current at its gate from Component A allowing a positive potential at the gate of Component B. It should be noted that although the transistors (Components A-D) are shown and described with particularity, in FIG. 2, as being a NPN or PNP transistor, a person having ordinary skill in the art will know that each PNP transistor can be exchanged for a NPN transistor while each NPN transistor can be exchanged for a PNP transistor so that the voltage source can have a positive potential but, the DRAM would operate in the same manner.

Components E, F, and G are placed to keep currents low. It should be noted that a person having ordinary skill in the art will note that Components E, F, and G may be configured differently on this circuit while providing the same function Component A is always on; that is, electron flow, directed from 1 to 6, is always available. As a consequence, when V=0 at D, "0" is read at D and, when V≠0, "1" is read at D. To write a "0", a signal is sent to component A from location 2 while V=0 at Component C and Component B. Hence V=0 at Component D.

To write a "1", a signal is sent to Component B from location 3. The signal sent should be long enough to allow a current to pass through Component B and activate Component C so as to create a continuous loop between Component B and Component C. The loop between Components B and C hold a signal until it is read at Component D.

Figure 3:
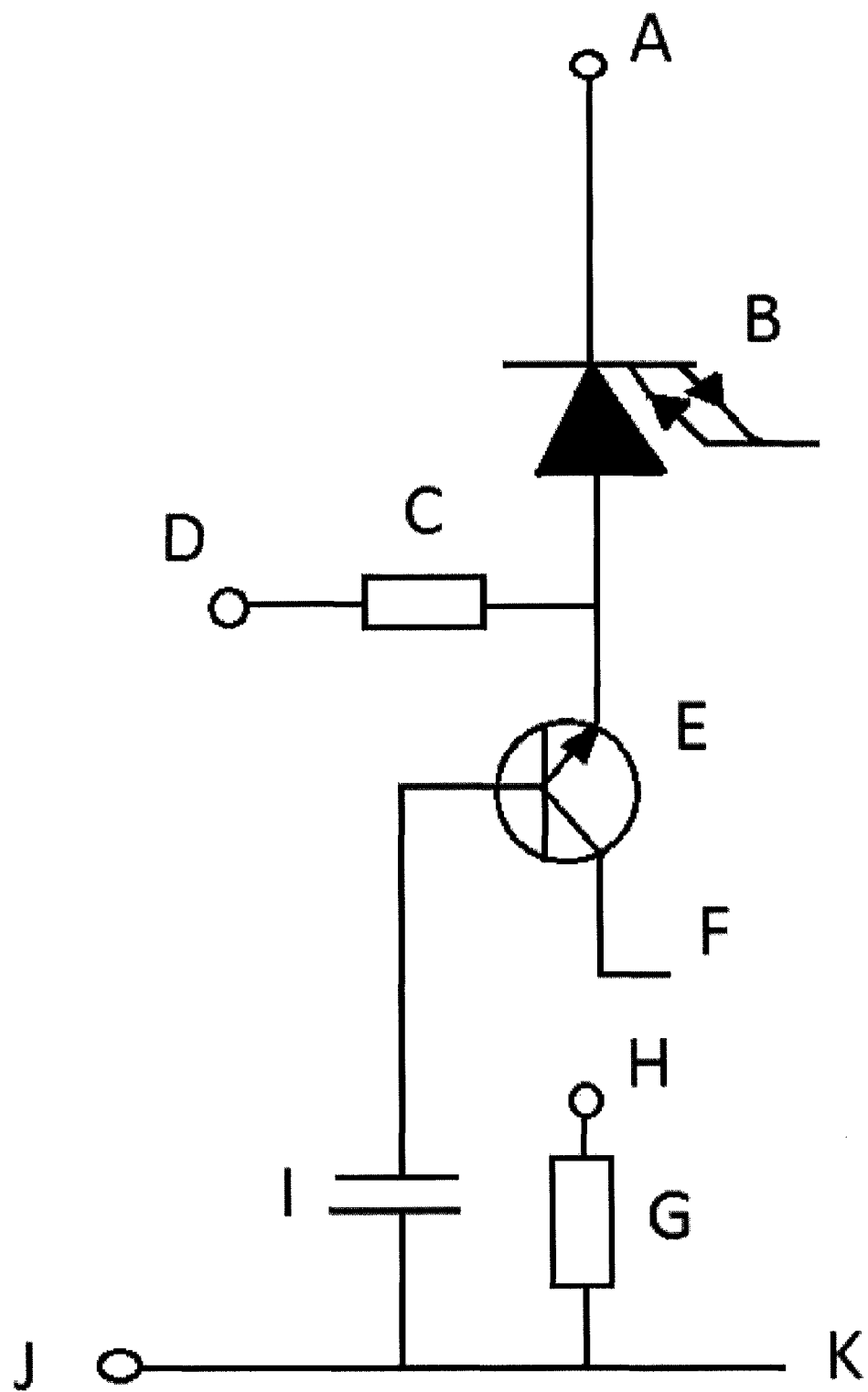
FIG. 3 is an embodiment of the circuit described herein.

In a second and third embodiment, the invention described herein relates to a circuit for a transistor DRAM and is shown, generally, in FIG. 3. These embodiments are advantageous for several reasons. First, the thyristor gate creates a faster system because there is no charge up time required. Second, there is no requirement to adjust the capacitor/resistor.

The components of the circuit are listed below:

| Component | Component Type |
| --- | --- |
| A | DC power supply |
| B | Gate controlled thyristor |
| C | Resistor |
| D | Positive lead to power supply |
| E | NPN transistor |
| F | Data output lead |
| G | Resistor |
| H | Negative lead to power supply |
| I | Capacitor |
| J | Positive lead to on switch |
| K | Lead to right adjacent memory cell |

Component A, a DC power supply, provides power for Component B, a gate controlled thyristor, which powers a readable voltage at Component F, a data output lead. That is, when Component B is in the on state, V=1 for a readable voltage at location F, when Component B is in the off state, V=0 for a readable voltage at location F. The voltage at A may be cycled on/off using Component B. Multiple memory cells may be used in conjunction with each other in conjunction with Component F.

In a third embodiment, a read switch extension is introduced by adding Component G, a resistor, Component I, a capacitor, Component J, a positive lead switch, and Component H, a negative lead to a power supply, and Component K, connection lead to the right adjacent memory cell. Components G and I are paired.

What is claimed is:

1. A memory storage device comprised of: at least one NPN depletion mode Transistor; at least two NPN transistors; at least one PNP transistor; at least one pull-down resistor; where current flows from the at least one NPN depletion mode transistor to the at least two NPN transistors.

2. The memory storage device of claim 1 comprises at least 3 Pull-down Resistors.

3. The memory circuit of claim 1 where the NPN depletion mode transistor and at least 2 NPN transistors run in series.

4. A memory storage device comprised of at least one: power supply, gate controller thyristor, resistor, positive lead supply, NPN transistor, data output lead; where current flows from the Power Supply to the Data Output Lead; where the power supply, gate controlled thyristor, resistor, and data output lead are in a series parallel configuration.

5. The memory storage device of claim 4 where the current flows from the power supply to the data output lead.

6. The memory storage device of claim 5 further comprises at least one: resistor, negative lead power supply, capacitor, positive lead, connection lead to adjacent memory cell.

7. The memory storage device of claim 6 where the resistor and capacitor are paired.

8. The memory storage device of claim 7 where:
   (a) the capacitor and resistor are connected in parallel, with the positive lead of the capacitor is connected to the positive lead of the resistor;
   (b) the negative lead of the capacitor is connected to the gate of the NPN transistor, and the negative lead of the resistor is connected to the negative lead power supply.

9. The memory storage device of claim 8 where the ohmic value of each resistor in each memory cell is incrementally increased to delay by turning on the NPN transistor in each successive memory cell to "read" the data stored in each memory cell.

* * * * *